US010510550B2

(12) United States Patent
Peck et al.

(10) Patent No.: US 10,510,550 B2
(45) Date of Patent: Dec. 17, 2019

(54) POLARIZATION-DEPENDENT LASER-ASSISTED PLASMA ETCHING

(71) Applicant: The Board of Trustees of the University of Illinois, Urbana, IL (US)

(72) Inventors: Jason A. Peck, Hillsboro, OR (US); David N. Ruzic, Pesotum, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 16/140,730

(22) Filed: Sep. 25, 2018

(65) Prior Publication Data

US 2019/0096684 A1 Mar. 28, 2019

Related U.S. Application Data

(60) Provisional application No. 62/563,326, filed on Sep. 26, 2017.

(51) Int. Cl.
| | |
|---|---|
| *H01L 21/3065* | (2006.01) |
| *H01L 21/268* | (2006.01) |
| *H01L 21/324* | (2006.01) |
| *H01J 37/00* | (2006.01) |
| *H01L 21/67* | (2006.01) |

(52) U.S. Cl.
CPC .......... *H01L 21/3065* (2013.01); *H01J 37/00* (2013.01); *H01L 21/268* (2013.01); *H01L 21/3247* (2013.01); *H01L 21/67069* (2013.01); *H01L 21/67115* (2013.01)

(58) Field of Classification Search
None
See application file for complete search history.

(56) References Cited

U.S. PATENT DOCUMENTS 9,171,733 B2 10/2015 Ruzic et al.

FOREIGN PATENT DOCUMENTS

WO WO 2015/175268 A1 11/2015

OTHER PUBLICATIONS

C. Arnone, et al., "Anisotropic Laser Etching of Oxidized (100) Silicon", *Appl. Phys. Lett.*, 54, (3) Jan. 16, 1989, pp. 225-227.
Colin T. Carver et al., "Atomic Layer Etching: An Industry Perspective", *ECS Journal of Solid State Science and Technology*, 4 (6) N5005-N5009 (2015).
C.H. Choy, et al., "Laser-Induced Etching of Silicon", *Applied Physics A*, 61, Jan. 30, 1995, pp. 45-50.
W. Holber, et al., "Laser-enhanced plasma etching of silicon", Appl. Phys. Left., 46 (2), Jan. 15, 1985, pp. 201-203.

(Continued)

*Primary Examiner* — Allan W. Olsen
(74) *Attorney, Agent, or Firm* — Brinks Gilson & Lione

(57) ABSTRACT

A method of laser-assisted plasma etching with polarized light comprises providing a surface of a substrate that includes at least one surface region having trenches arranged in a unidirectional pattern along an x-direction or a y-direction of the surface, where each trench has a depth along a z-direction. The trenches extend substantially in parallel with each other and have a half-pitch of about 100 nm or less. The surface is exposed to a plasma and simultaneously illuminated with a pulsed laser beam having a predetermined polarization along the x-direction or the y-direction, and the trenches are etched.

20 Claims, 9 Drawing Sheets
(4 of 9 Drawing Sheet(s) Filed in Color)

(56) References Cited

OTHER PUBLICATIONS

Masashi Ishii, et al., "Digital Etching Using KrF Excimer Laser: Approach to Atomic-Order-Controlled Etching by Photo Induced Reaction", *Jpn. J. Appl. Phys.*, vol. 32, Part 1, No. 12B, Dec. 1993, pp. 6178-6181.

Amirkianoosh Kiani, et al., "Maskless lithography using silicon oxide etch-stop layer induced by megahertz repetition femtosecond laser pulses", *Optics Express*, vol. 19, No. 11, May 23, 2011, pp. 10834-10842.

P. Leerungarawat, et al, "Effect of UV Light Irradiation on SiC Dry Etch Rates", *Journal of Electronic Materials*, vol. 29, No. 3, 2000, pp. 342-346.

G.L. Loper, et al., "UV Laser Etching Processes for Film Layers Used in Silicon Integrated Circuits", *Applied Surface Science*, 36 (1982) pp. 257-266.

P. A. Maki, et al., "Laser bilayer etching of GaAs surfaces", *Appl. Phys. Lett.*, 55 (2), Jul. 10, 1989, pp. 91-93.

Jason A. Peck, et al., "Mechanism behind dry etching of Si assisted by pulsed visible laser", *Journal of Applied Physics*, 122, 173304 (2017).

J.L. Peyre, et al., "Laser-Induced Photoetching of Semiconductors and Metals", *Applied Surface Science*, 36 (1989) pp. 313-321.

D. Riedel, et al., "Fabrication of ordered arrays of silicon cones by optical diffraction in ultrafast laster etching with $SF_6$", *Appl. Phys. A*, 78, pp. 381-385 (2004).

W. Sesselmann, et al., "Reaction of Silicon with Chlorine and Ultraviolet Laser Induced Chemical Etching Mechanisms", *Journal of Vacuum Science & Technology B*, 7, 1284 (1989).

Hyungjoo Shin, et al., "Surprising importance of photo-assisted etching of silicon in chlorine-containing Plasmas", *Journal of Vacuum Science & Technology A*, 30(2), 021306-1-021306-10 (2012).

ation Ser. No. 62/563,326, filed Sep. 26, 2017, and which
POLARIZATION-DEPENDENT LASER-ASSISTED PLASMA ETCHING

RELATED APPLICATION

The present patent document claims the benefit of priority under 35 U.S.C. § 119(e) to U.S. Provisional Patent Application Ser. No. 62/563,326, filed Sep. 26, 2017, and which is hereby incorporated by reference in its entirety.

TECHNICAL FIELD

The present disclosure is directed generally anisotropic etching and more specifically to laser-assisted plasma etching.

BACKGROUND

Etching, which entails removing material from a surface, is commonly used in the fabrication of semiconductor devices and may constitute roughly one-third of semiconductor device manufacturing. Critical challenges in device fabrication are reliably etching ever-smaller features and preserving surface fidelity.

Etch methods used in research and industry include wet chemical etching, which employs liquid chemicals or etchants for material removal, and dry etching, which utilizes gaseous chemicals or high energy ions for material removal. Wet chemical etching is generally isotropic. If directionality is important for high-resolution pattern transfer, wet etching is normally not used. Dry etching can be carried out with high energy particle beams, a gaseous chemical reaction, or a combination of both to achieve anisotropic etching. Reactive ion etching (RIE), which uses both physical and chemical reactions to etch high resolution features, is among the most widely used dry processes in industry and research. However, the high energy of ions in RIE can be a key culprit in causing surface disorder or damage and material mixing. Damage of even one nanometer in depth can be detrimental to the performance of a semiconductor device in next-generation technology nodes.

BRIEF SUMMARY

A method of laser-assisted plasma etching with polarized light is described in this disclosure.

The method comprises, according to one embodiment, providing a surface of a substrate that includes at least one surface region having trenches arranged in a unidirectional pattern along an x-direction or a y-direction of the surface, where each trench has a depth along a z-direction. The trenches extend substantially in parallel with each other and have a half-pitch of about 100 nm or less. The surface is exposed to a plasma and simultaneously illuminated with a pulsed laser beam having a predetermined polarization along the x-direction or the y-direction, and the trenches are etched.

The method comprises, according to another embodiment, providing a surface of a substrate that includes at least one surface region having trenches arranged in a bidirectional pattern along an x-direction and a y-direction of the surface, where each trench has a depth along a z-direction. The trenches in the bidirectional pattern comprise (a) first trench portions extending substantially in parallel with each other along the x-direction with a half-pitch of about 100 nm or less, and (b) second trench portions extending substantially in parallel with each other along the y-direction with a half-pitch of about 100 nm or less. The surface is exposed to a plasma and simultaneously illuminated with a pulsed laser beam having a predetermined polarization along the x-direction or the y-direction, and the trenches are etched. Due to the predetermined polarization of the pulsed laser beam, the first trench portions are etched differently than the second trench portions.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 5A shows the trenches prior to etching; FIG. 5B shows the trenches after plasma etching without laser exposure; and FIGS. 5C and 5D show the trenches after plasma etching with laser exposure, where the laser polarization is applied perpendicular to the trench line (in the horizontal or x-direction) and parallel to the trench line (out of the page or in the y-direction), respectively.

DETAILED DESCRIPTION

The laser-assisted plasma etching process described herein addresses the need for a damage-free, anisotropic etching method for integrated circuits (ICs) having feature sizes of 100 nm or less. The new etch method utilizes polarized light to etch 3D structures that lie along a selected direction on a semiconductor wafer without etching perpendicular features. Implementation of this technology in device manufacturing may enable fabrication of ICs with smaller feature sizes.

Figure 1A:
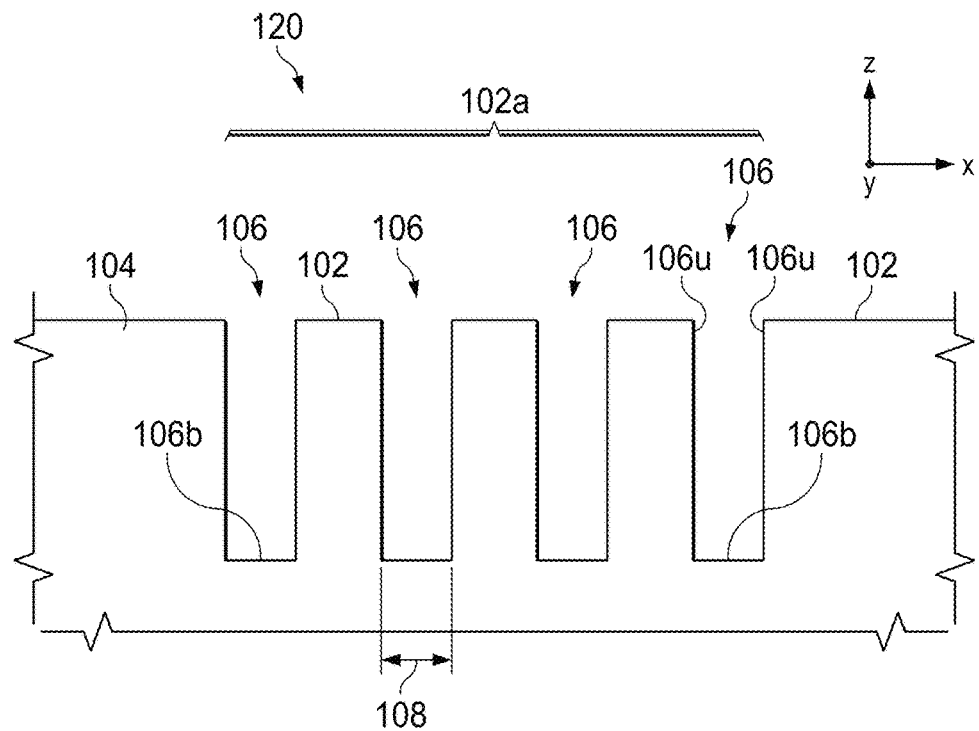
FIG. 1A is a cross-sectional schematic of a line of trenches in a surface of a substrate.
Figure 1B:
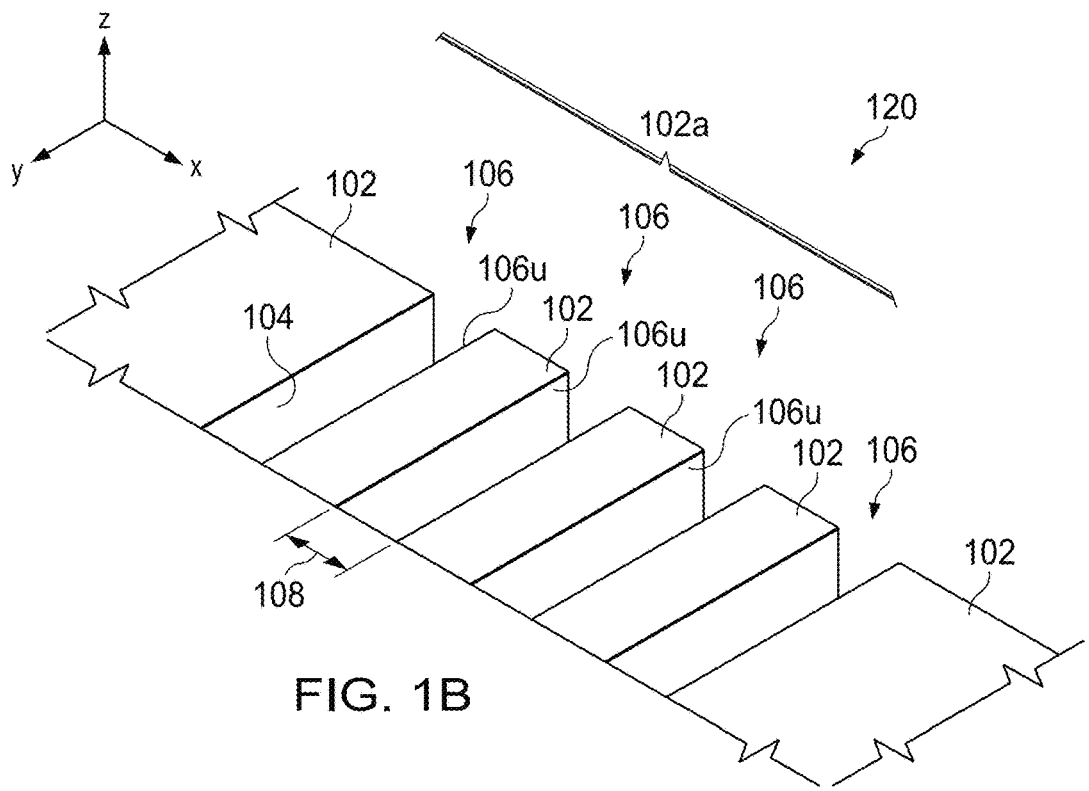
FIG. 1B is a perspective view of the linear array of trenches shown in FIG. 1A, showing the unidirectional pattern on the surface of the substrate.
Figure 2A:
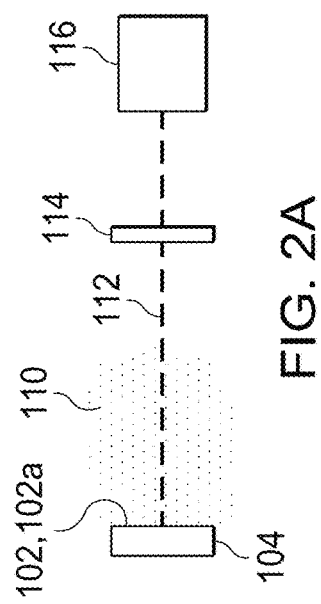
FIG. 2A shows a schematic of a laser-assisted plasma etching process.

Referring now to FIGS. 1A and 1B, the method of laser-assisted plasma etching with polarized light comprises, according to one embodiment, providing a surface 102 of a substrate 104 that includes at least one surface region 102a having trenches (or portions of trenches) 106 arranged in a unidirectional pattern 120 along an x-direction or a y-direction of the surface 102, where each trench 106 has a depth along a z-direction. The trenches 106 extend substantially in parallel with each other and have a half-pitch 108 of about 100 nm or less. Referring to FIG. 2A, the surface 102 is exposed to a plasma 110 and simultaneously illuminated with a pulsed laser beam 112 having a predetermined polarization along the x-direction or the y-direction, and the trenches 106 are etched. Advantageously, the surface 102 is not damaged by ion bombardment during etching.

The polarization of the pulsed laser beam 112 may be determined by a polarization filter (or polarized filter) 114 disposed between a source 116 of the pulsed laser beam 112 and the surface 102 of the substrate 104, as illustrated in FIG. 2A. The polarization filter 114 may be a linear polarization filter. The surface region(s) 102a may include least two, at least three, or at least four, and up to hundreds, thousands or even millions of trenches 106 arranged in the unidirectional pattern 120. Each of the trenches 106 may have a depth-to-width aspect ratio from about 1:1 to about 100:1, where width is measured in the x- or y-direction and depth is measured in the z-direction. Typically, the depth-to-width aspect ratio is at least about 2:1, at least about 5:1, or at least about 10:1, and may be as high as 100:1. The depth of the trenches may lie between about 100 nm and about 10 microns. The substrate 104 may comprise a semiconductor selected from among the following: silicon, germanium, and III-V semiconductors, such as GaAs. The substrate 104 may be a single-crystalline, polycrystalline, or amorphous semiconductor wafer.

The nature of the etching that occurs during simultaneous exposure to the plasma 110 and the pulsed laser beam 112 depends on whether the polarization of the beam 112 is aligned with or perpendicular to the trenches. When the trenches 106 extend in parallel with each other along a selected direction, such as the y-direction as shown in the exemplary schematics of FIGS. 1A and 1B, and the predetermined polarization of the pulsed laser beam 112 is perpendicular to that direction (the y-direction), the etching entails preferential etching of base regions 106b of the trenches. In this case, during the illumination of the surface 102, the base regions 106b may be locally heated, which promotes selective etching of the base regions 106b. As would be recognized by the skilled artisan, the y-direction mentioned above may be any selected direction in the x-y plane as long as (a) the trenches 106 extend substantially in parallel with each other along the selected direction, and (b) the predetermined polarization of the pulsed laser beam 112 is perpendicular to the selected direction, which may be referred to as the "alignment direction" of the trenches.

When the trenches 106 extend in parallel with each other along the y-direction, as shown in FIGS. 1A and 1B, and the predetermined polarization of the pulsed laser beam 112 is aligned with or parallel to the y-direction, the etching entails preferential etching of upper regions 106u of the trenches 106. In this example, during the illumination of the surface 102, the upper regions 106u are locally heated. As above, the y-direction mentioned in this example may be any selected direction in the x-y plane as long as (a) the trenches 106 extend substantially in parallel with each other along the selected direction, and (b) the predetermined polarization of the pulsed laser beam 112 is aligned with the selected direction.

The term "base region" may be understood to refer to a bottom-most portion of a trench that lies between sidewalls of the trench. The term "upper region" may be understood to refer to upper-most portions (e.g., top 1-10%) of sidewalls of a trench that intersect with the surface of the substrate. In addition, trenches described as extending "in parallel" or "substantially in parallel" with each other are nominally in parallel except for any minor deviations (e.g., +/−1° or less) along the length of the trenches that may be due to, for example, manufacturing imperfections or surface/substrate defects. As would be recognized by the skilled artisan, the above definitions apply to trenches as well as to portions of trenches or "trench portions," which are discussed below.

The polarization dependence of light incident on a line (or linear array) of trenches is revealed by computer modeling and further confirmed experimentally by laser-assisted plasma etching experiments, as described in the Examples. Two conditions are tested: a polarization oriented perpendicular and parallel to the alignment direction of the trenches. Computationally and experimentally, the polarization dependence of laser-assisted plasma etching is evaluated for trenches arranged in unidirectional patterns having features much smaller than the wavelength of the pulsed laser beam.

Figure 1C:
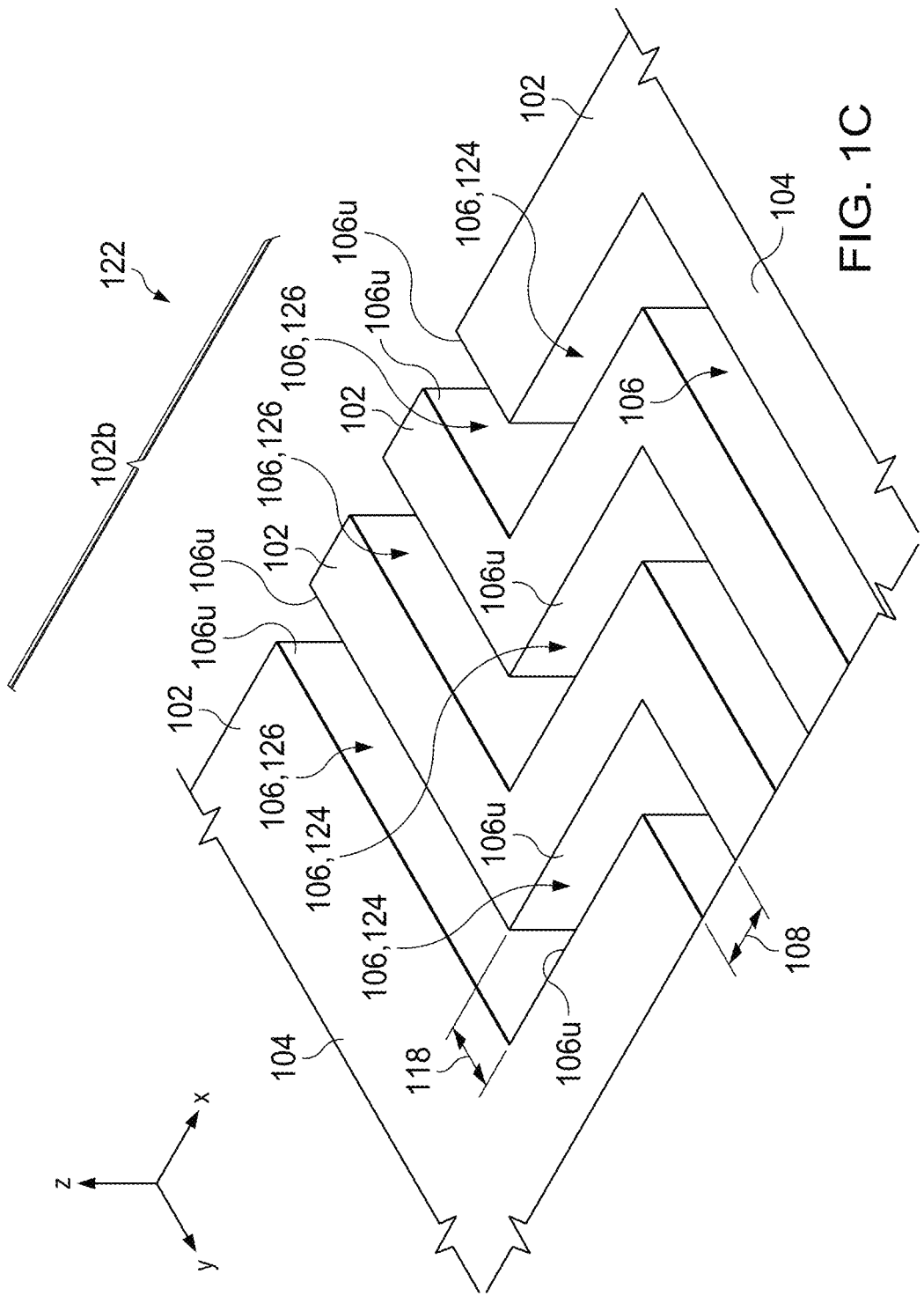
FIG. 1C is a perspective view of trenches arranged in a bidirectional pattern.

Referring now to FIG. 1C, the method may also or alternatively entail providing a surface 102 of a substrate including at least one surface region 102b having trenches 106 arranged in a bidirectional pattern 122 along an x-direction and a y-direction of the surface 102, where each trench 106 has a depth along a z-direction. As would be recognized by the skilled artisan, the x-direction may be any selected direction in the x-y plane, and the y-direction is perperpendicular to that direction, also in the x-y plane. The trenches 106 in the bidirectional pattern 122 comprise (a) first trench portions 124 extending substantially in parallel with each other along the x-direction with a half-pitch 118 of about 100 nm or less, and (b) second trench portions 126 extending substantially in parallel with each other along the y-direction with a half-pitch 108 of about 100 nm or less. The first trench portions 124 and the second trench portions 126 may or may not be connected to one another. As shown schematically in FIG. 2A, the surface 102 is exposed to a plasma 110 while being illuminated with a pulsed laser beam 112 having a predetermined polarization along the x-direction or the y-direction, and the trenches 106 are etched.

Due to the predetermined polarization of the pulsed laser beam 112, the first trench portions 124 are etched differently than the second trench portions 126. If the predetermined polarization of the pulsed laser beam 112 is perpendicular to the x-direction, the etching of the trenches 106 comprises preferential etching of base regions (not visible in FIG. 1C) of the first trench portions 124 and preferential etching of upper regions 106u of the second trench portions 126. Accordingly, during the illumination of the surface 102, the base regions of the first trench portions 124 are locally heated while the upper regions 106u of the second trench portions 126 are locally heated.

If, on the other hand, the predetermined polarization of the pulsed laser beam 112 is perpendicular to the y-direction, the etching of the trenches 106 comprises preferential etching of upper regions of the first trench portions 124 and preferential etching of base regions of the second trench portions 126. In this case, during the illumination of the surface 102, the upper regions 106u of the first trench portions 124 are locally heated while the base regions (not visible in FIG. 1C) of the second trench portions 126 are locally heated. Advantageously, the surface 102 is not damaged by ion bombardment during etching, regardless of the polarization of the laser beam 112.

Figure 2B:
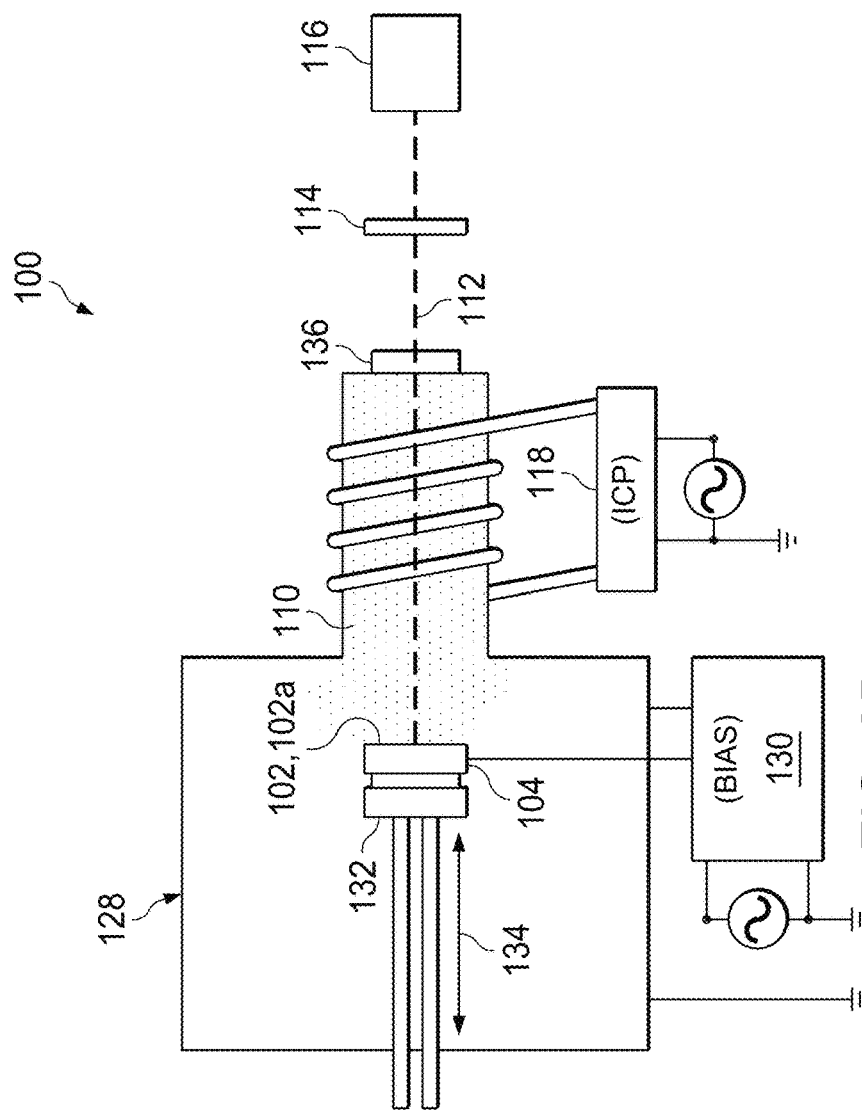
FIG. 2B shows a schematic of an apparatus for laser-assisted plasma etching.

An inductively coupled plasma (ICP) source 118, as shown schematically in FIG. 2B, may be used to generate the plasma 110. In the examples discussed below, a 13.56 MHz ICP source is employed. Alternatively, a capacitively-coupled plasma source or a wave-heated plasma source may be used. The plasma 110 may comprise an ionized noble gas and an ionized etch gas. The ionized noble gas may include one or more of Ar, He, and Ne. The ionized etch gas may include one or more gases selected from $C_xF_y$, where $1 \le x \le 12$ and $1 \le y \le 12$ (e.g., $C_4F_8$), $SF_6$ and $Cl_2$. In one example, the plasma 110 may comprise Ar, $C_4F_8$ and $O_2$; in another example, the plasma 110 may comprise Ar and $SF_6$.

Typically, the pulsed laser beam 112 is pulsed at a frequency in a range from about 50 Hz to about 1,000 Hz, or from greater than 1,000 Hz to about 10,000 Hz. The pulsed laser beam 112 may have an energy density in a range from about 5 mJ/cm²/pulse to about 50 mJ/cm²/pulse. The pulsed laser beam 112 may have a Gaussian pulse duration in a range from about 0.5 ns to about 100 ns, or from about 2 ns to about 20 ns.

The pulsed laser beam 112 may have a wavelength larger than the half-pitch 108 of the trenches 106. In some cases the wavelength may be significantly larger than the half-pitch 108, such as at least about an order of magnitude larger than the half-pitch 108. Typically, the half-pitch is about 50 nm or less, about 30 nm or less, or about 10 nm or less, and as small as about 5 nm, or as small as about 2 nm. As illustrated in FIGS. 1A-1C, the half-pitch 108 is the distance between adjacent trenches 106 measured normal to each trench 106. The trenches 106 may also have a critical dimension (e.g., width) about 100 nm or less, or about 50 nm or less, and as small as about 5 nm, or as small as about 2 nm. The pulsed laser beam may have a wavelength in a range from about 200 nm to about 1,100 nm, such as 1,064 nm. The wavelength may also lie in the range from about 380 nm to about 750 nm, i.e., visible light wavelengths.

FIG. 2B provides a schematic of an apparatus 100 suitable for laser-assisted plasma etching. The apparatus 100 includes a ConFlat cross 128 (e.g., 10 in-diameter; Kurt J. Lesker Co., Jefferson Hills, Pa.) suitable for maintaining vacuum conditions and/or a controlled gaseous environment. A semiconductor substrate 104 having a surface 102 to be etched is placed on an anodized aluminum chuck and mounted to a sample support 132 via load lock and transfer arm. The water-cooled support 132 holds the substrate 104 during processing. An upstream ICP source 118 supplies etch radicals and ions to the surface 102 with density independent of plasma sheath potential. An optional radiofrequency (RF) bias (e.g., 13.56 MHz) 130 and linear motion 134 allows for control of both plasma density and ion energy arriving at the substrate surface 102. Process gases are regulated (e.g., 100 sccm flow rate) by mass flow controllers and injected through an inlet in the beam window 136.

The method may further include additional processing steps prior to etching the surface 102 of the substrate 104. For example, the unidirectional or bidirectional pattern(s) 120,122 in which the trenches 106 are arranged on the surface 102 may be formed by lithographic patterning using techniques known in the art. Given the small feature sizes, the lithographic patterning may comprise extreme ultraviolet (EUV) lithography.

EXAMPLES

Prior to this work, it was not expected that laser-assisted plasma etching would be compatible with feature sizes much smaller than the wavelength of the laser. It was not known, for example, if a laser beam having a wavelength in the visible range could adequately heat the base of trenches having a nanoscale feature size (e.g., less than 100 nm). To answer this question and others, computer simulations involving wave optics and heat transfer using COMSOL Multiphysics® modeling software were carried out initially, followed by laser-assisted plasma etching experiments.

Figure 3A:
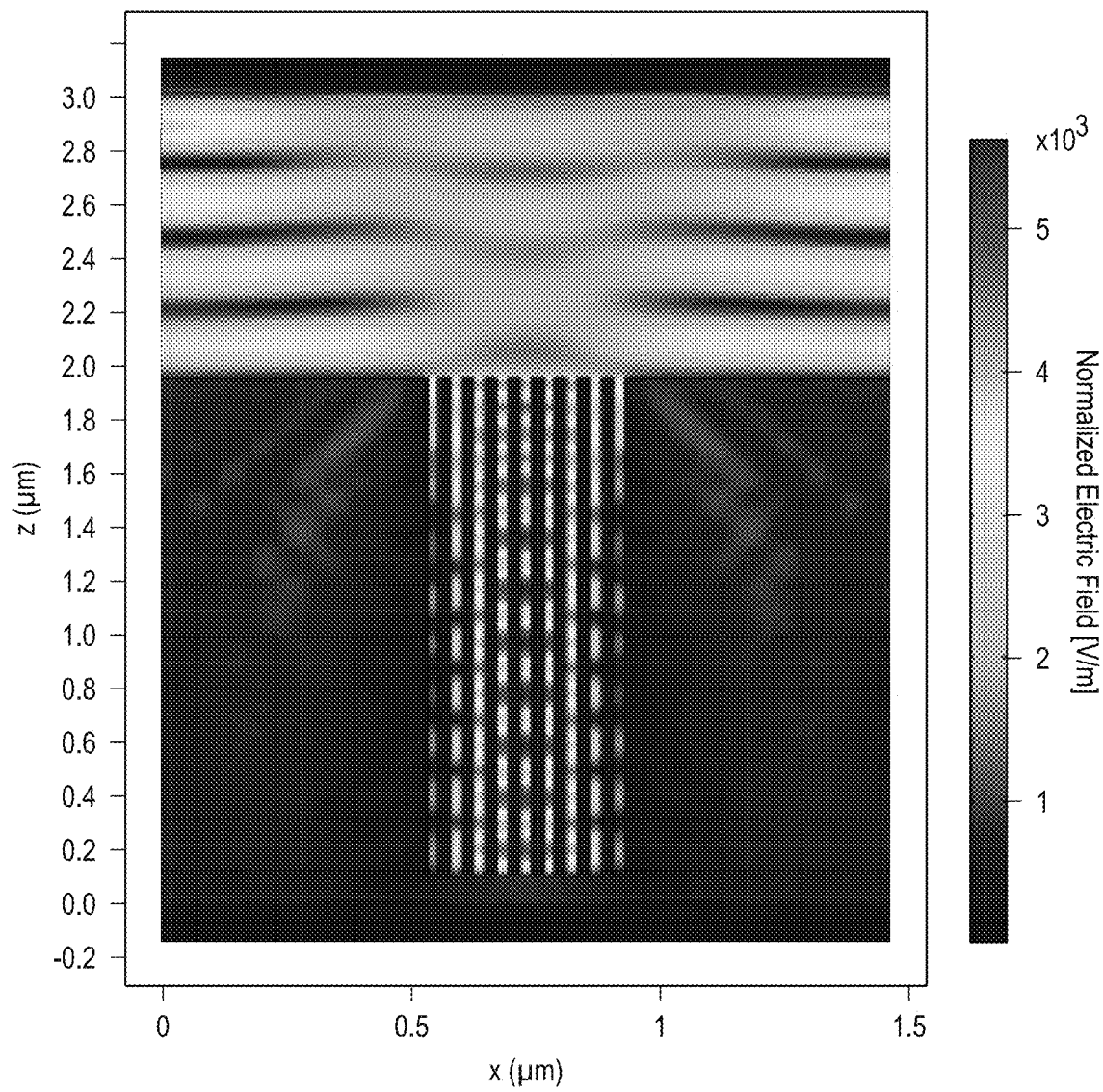
FIGS. 3A and 3B show plots of normalized electric field obtained from frequency domain simulations, where the polarization of the laser beam is perpendicular to the trenches in FIG. 3A (horizontal to page; x-direction) and parallel to the trenches in FIG. 3B (out of the page; y-direction).
Figure 3B:
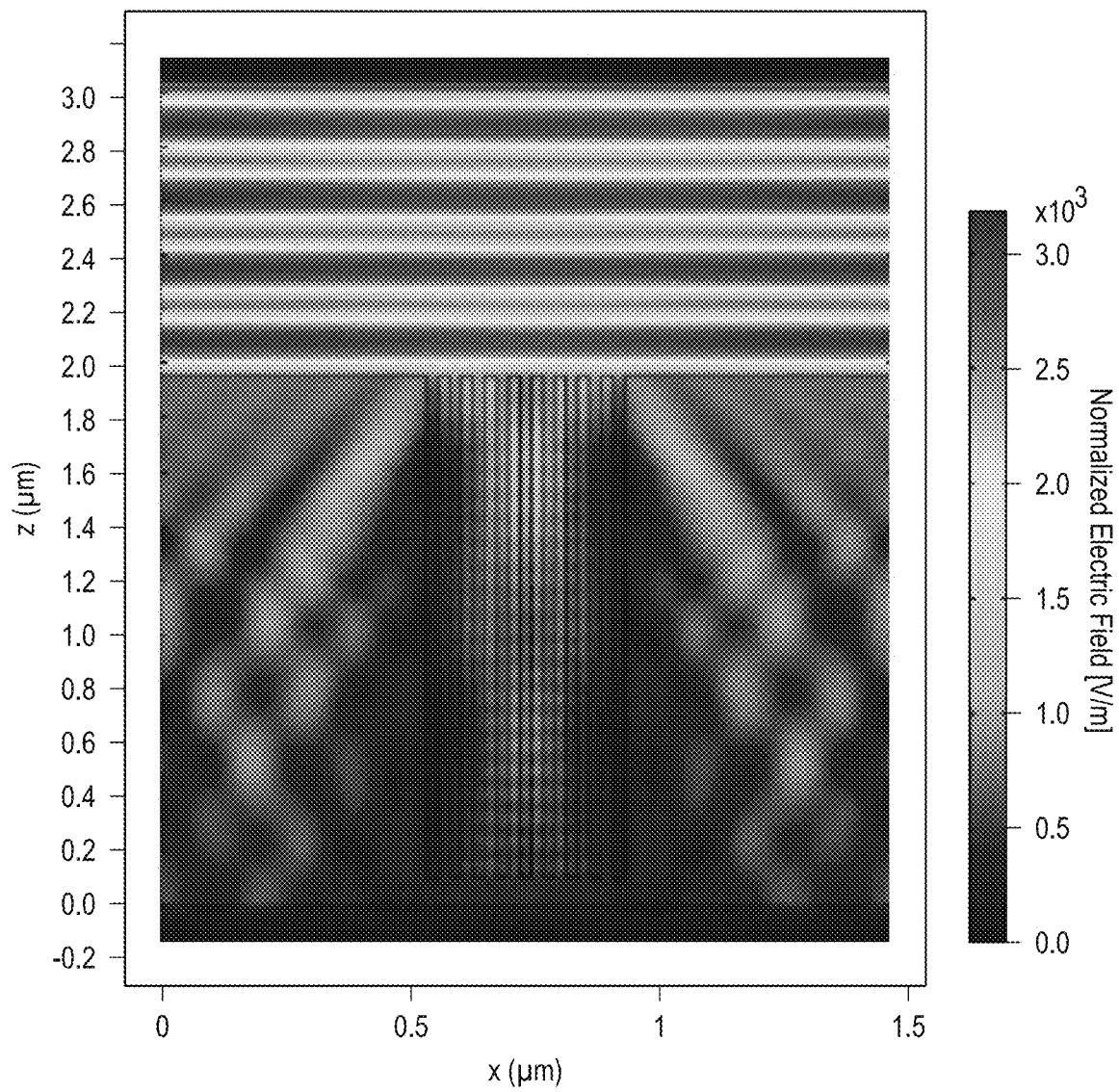

The simulations employed nine trenches arranged in a unidirectional pattern with a half-pitch of 22 nm on a silicon surface. Each trench had a large aspect ratio of 80. During the simulations, the trenches, which extend in parallel in the y-direction (out of the page), were exposed to a surface normal plane wave generated by a 532 nm-wavelength laser beam. Trenches were finely meshed with six elements per opening with an incident field corresponding to 1 W/cm² laser fluence. FIGS. 3A and 3B show plots of normalized electric field obtained from frequency domain simulations, where the polarization of the laser beam is perpendicular to the trenches in FIG. 3A (horizontal to page; x-direction) and parallel to the trenches in FIG. 3B (out of the page; y-direction). As described above, the trenches have a depth in the z-direction.

Surprisingly, the simulations revealed that the trenches behave as polarization-selective waveguides. When the polarization is perpendicular to the trenches, an in-trench wavelength of roughly 370 nm is observed, which is between the vacuum wavelength ($\lambda_0$=532 nm) and the wavelength in silicon ($n_{Si,532\ nm}$=4.14, $\lambda_{Si,532\ nm}$=129 nm). The perpendicular polarization condition shows light propagation deep within the trenches, even at the high modeled aspect ratio of 80. When polarization is parallel to the trenches, however, in-trench light propagation does not occur.

Figure 4A:
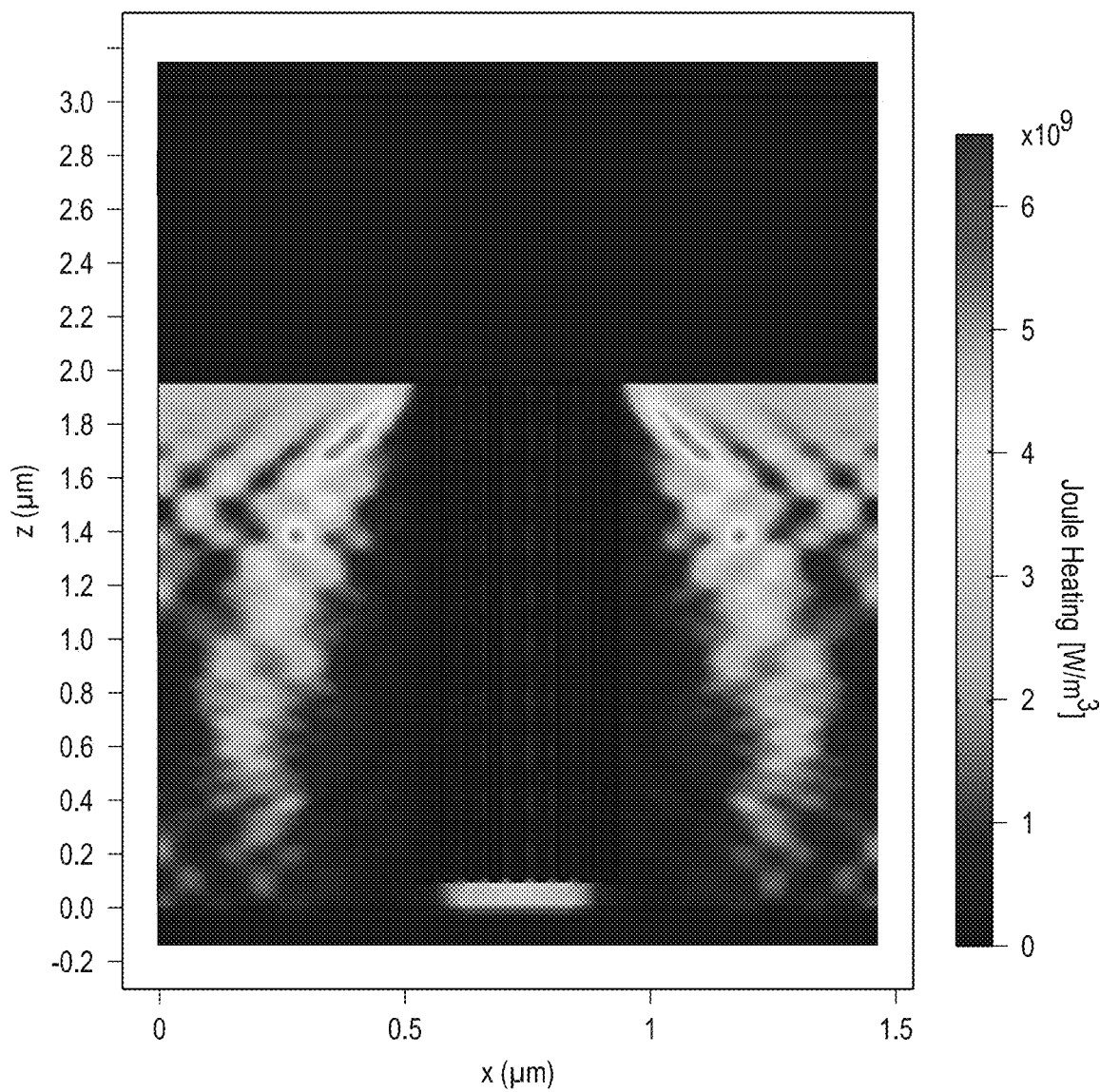
FIGS. 4A and 4B show plots of resistive losses obtained from frequency domain simulations, where the polarization of the laser beam is perpendicular to the trenches in FIG. 4A (horizontal to page; x-direction) and parallel to the trenches in FIG. 4B (out of the page; y-direction).
Figure 4B:
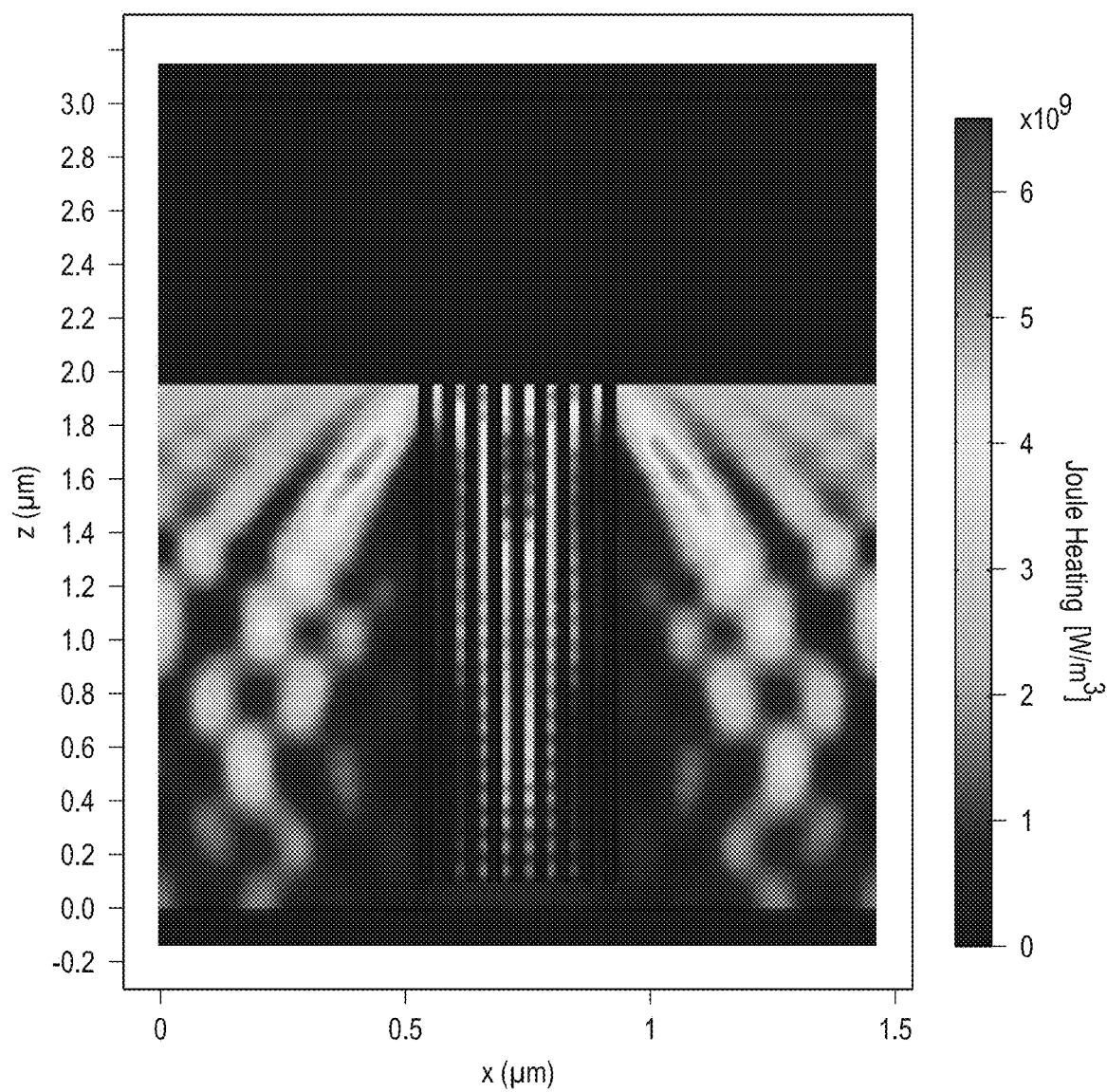

Resistive heating due to the incident wave is plotted for each polarization in FIGS. 4A and 4B, where it can be observed that the resistive losses align with the electric field plots in FIGS. 3A and 3B, respectively. The perpendicular polarization condition shown in FIG. 4A shows deep trench power delivery and heating, while the parallel polarization condition shown in FIG. 4B shows rapid heat dissipation at the upper regions of the trenches.

The polarization dependence of light incident on a line or array of trenches with feature size$\ll\lambda_0$, as revealed by computer modeling as described above, is further confirmed experimentally by laser-assisted plasma etching experiments on parallel trenches. Two conditions are tested by employing a frequency doubled Nd:YAG pulsed laser beam: a polarization oriented perpendicular and parallel to the alignment direction of the trenches. The simulations and power dissipation results suggest that a polarization perpendicular to the alignment direction of the trenches may substantially heat base regions of the trenches, while a polarization parallel to the alignment direction may substantially heat upper regions of the trenches. This location-selective heating can influence the shape of the etched features, that is, the etch profile.

To verify the results from the simulations, etching experiments are carried out on a silicon surface region that includes trenches arranged in a unidirectional pattern with a 60±5 nm critical dimension (e.g., trench width), 100±2 nm full-pitch, and 120±10 nm depth. The surface is subjected to a brief, dilute Ar/$SF_6$ etch with no bias, with the substrate positioned downstream (e.g., within about 20 cm) from an ICP discharge (e.g., 100 W, 13.56 MHz). The etching is carried out for 60 s with a 50:1 sccm Ar/$SF_6$ etch recipe. This brief, dilute etch is chosen because of the absence of a hardmask on the patterned wafers.

Figure 5A:
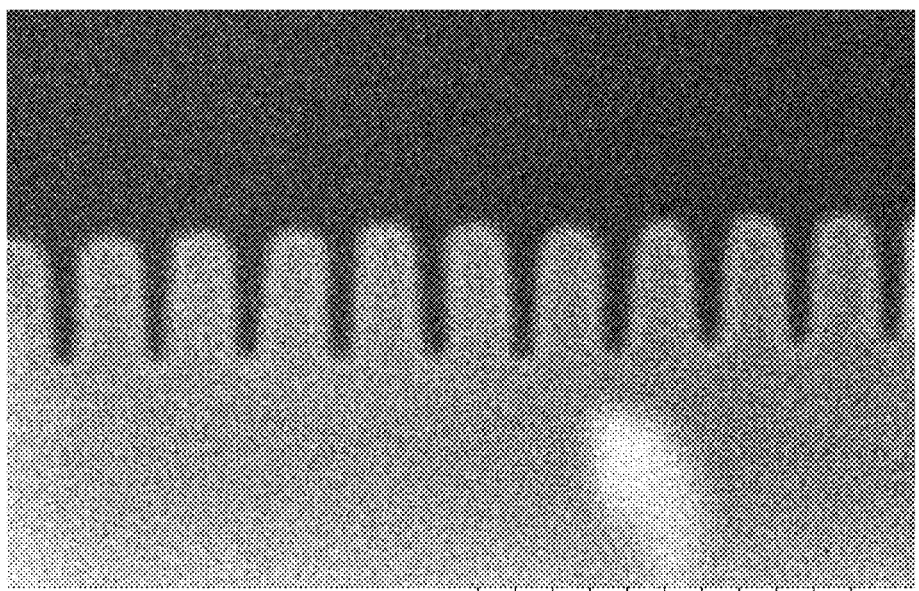
FIGS. 5A-5D are scanning electron microscope (SEM) images showing the evolution of the sample surface, before and after etching, with and without laser exposure.
Figure 5B:
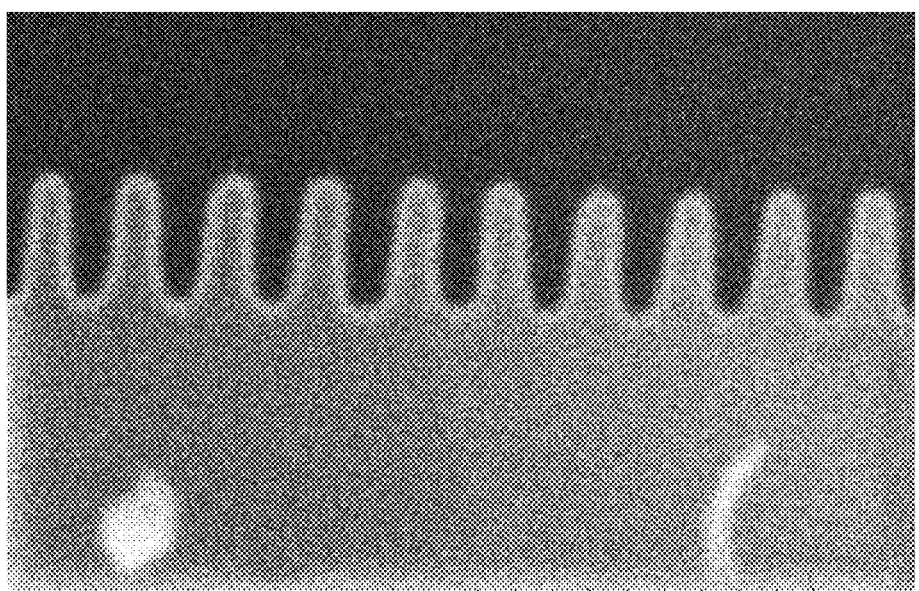

The evolution of the profile, before and after etching, with and without laser exposure, is pictured in the cross-sectional scanning electron microscope (SEM) images of FIGS. 5A-5D. The pre-existing trench structure is shown in FIG. 5A. FIG. 5B shows the trenches after plasma etching under the conditions mentioned above without laser exposure.

In the FIG. 5B example, there is no substrate bias and etching is primarily from radicals. The results show the critical dimension of the trenches is reduced from 65±5 nm to 50±3 nm, while the depth remains generally the same due to etching of both the top and bottom of the features.

A pulsed laser beam is then introduced for the duration of the etch with a perpendicular or parallel polarization with respect to the alignment direction of the trenches, as explained above. In these experiments, a 532 nm Nd:YAG laser pulsed at 100 Hz and having an energy density of about 40 mJ/cm$^2$/pulse is employed.

Figure 5C:
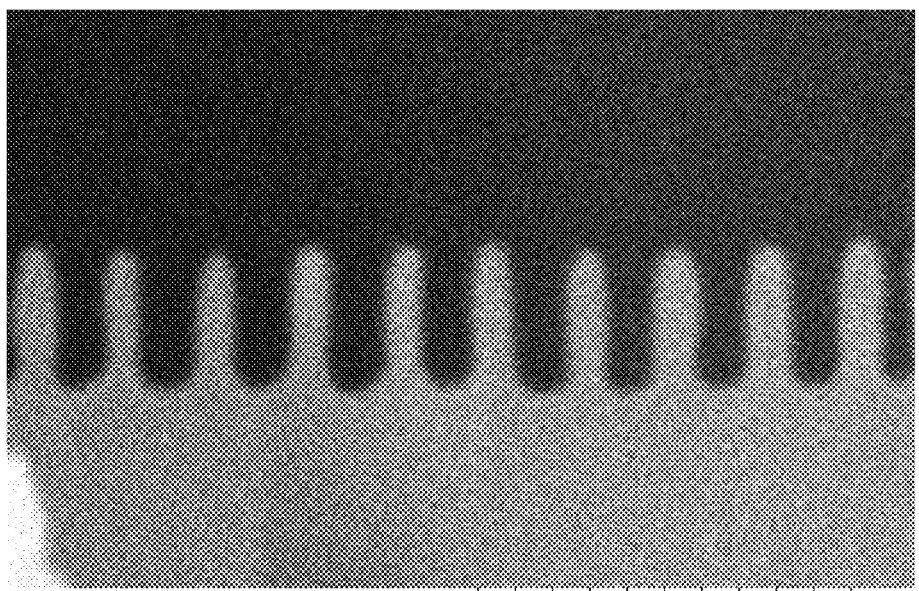
Figure 5D:
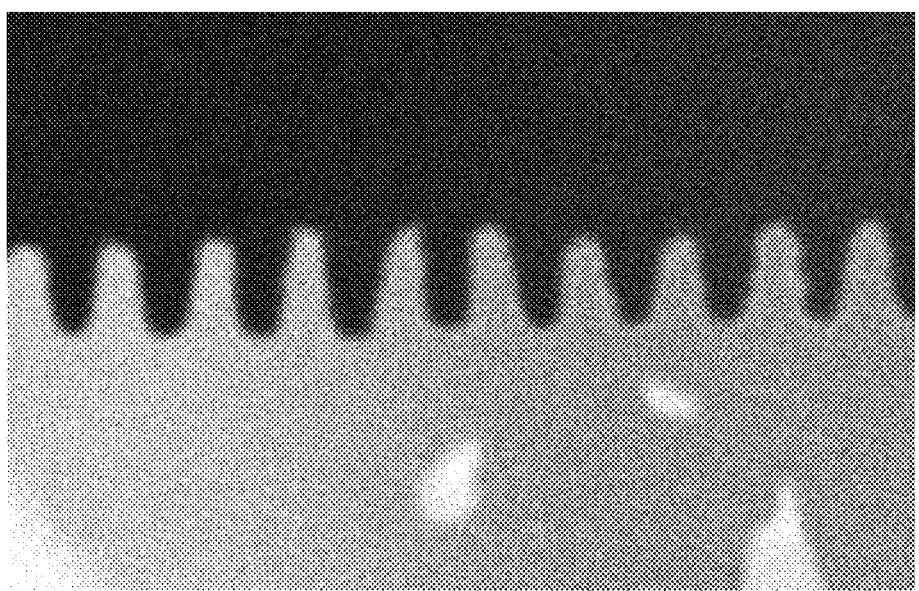

FIGS. 5C and 5D show the evolution of the trench profile with a laser polarization applied perpendicular to the trench line (in the horizontal or x-direction) and parallel to the trench line (out of the page or in the y-direction), respectively. It observed that the pulsed laser beam having the perpendicular polarization etches anisotropically, deepening the trenches from a depth of 120±2 nm to 140±5 nm and slightly undercutting at the base of each trench, as shown in FIG. 5C. While the sidewalls are slightly thinner than the no-laser control etched sample shown in FIG. 5B, the etching at the base of each trench is much more aggressive, consistent with the COMSOL material heating data shown in FIG. 4A. The feature undercutting at the trench base may be avoided by decreasing laser pulse intensity to prevent heat spillover to the trench sidewalls. In contrast, the pulsed laser beam having the parallel polarization degrades the trench profile post-etch to a drastically-diminished depth of 90±10 nm, removing upper portions of the trenches so as to taper the sidewalls.

As predicted by the wave optics simulations shown in FIGS. 4A and 4B, appreciable power delivery to the base of each trench promotes deepening of the trenches, while the topical heating in the parallel polarization case aggressively etches away upper regions of the trenches, decreasing trench depth. This work demonstrates that semiconductor wafers patterned with very small feature sizes may be controllably etched using pulsed laser-assisted plasma etching.

While various embodiments have been described, it will be apparent to those of ordinary skill in the art that many more embodiments and implementations are possible. Accordingly, the embodiments described herein are examples, not the only possible embodiments and implementations.

Furthermore, the advantages described above are not necessarily the only advantages, and it is not necessarily expected that all of the described advantages will be achieved with every embodiment.

What is claimed is:

1. A method of laser-assisted plasma etching with polarized light, the method comprising:
    providing a surface of a substrate including at least one surface region having trenches arranged in a unidirectional pattern along an x-direction or a y-direction of the surface, each trench having a depth along a z-direction, wherein the trenches extend substantially in parallel with each other and have a half-pitch of about 100 nm or less;
    exposing the surface to a plasma;
    illuminating the surface with a pulsed laser beam during the exposure to the plasma, the pulsed laser beam having a predetermined polarization along the x-direction or the y-direction; and
    etching the trenches.

2. The method of claim 1, wherein the trenches extend in parallel with each other along the x-direction, and wherein the predetermined polarization of the pulsed laser beam is perpendicular to the x-direction.

3. The method of claim 2, wherein the etching of the trenches comprises preferential etching of base regions of the trenches, and
    wherein, during the illumination of the surface, the base regions are locally heated.

4. The method of claim 1, wherein the trenches extend in parallel with each other along the x-direction, and
    wherein the predetermined polarization of the pulsed laser beam is aligned with the x-direction.

5. The method of claim 4, wherein the etching of the trenches comprises preferential etching of upper regions of the trenches, and
    wherein, during the illumination of the surface, the upper regions are locally heated.

6. The method of claim 1, wherein the half-pitch is about 50 nm or less.

7. The method of claim 1, wherein the pulsed laser beam has a wavelength at least about an order of magnitude larger than the half-pitch.

8. The method of claim 1, wherein the pulsed laser beam has a wavelength in a range from about 200 nm to about 1,100 nm.

9. The method of claim 1, wherein the plasma is generated by a plasma source selected from the group consisting of: an inductively coupled plasma source, a capacitively-coupled plasma source, and a wave-heated plasma source.

10. The method of claim 1, wherein the plasma comprises:
    an ionized noble gas selected from the group consisting of: Ar, He, and Ne; and
    an ionized etch gas selected from the group consisting of: $SF_6$, $Cl_2$, $C_4F_8$, and $C_xF_y$, where $1 \leq x \leq 12$ and $1 \leq y \leq 12$.

11. The method of claim 1, wherein the substrate comprises a semiconductor.

12. The method of claim 1, wherein the surface is not damaged by ion bombardment during etching.

13. A method of laser-assisted plasma etching with polarized light, the method comprising:
    providing a surface of a substrate including at least one surface region having trenches arranged in a bidirectional pattern along an x-direction and a y-direction of the surface, each trench having a depth along a z-direction, the trenches in the bidirectional pattern comprising (a) first trench portions extending substantially in parallel with each other along the x-direction with a half-pitch of about 100 nm or less, and (b) second trench portions extending substantially in parallel with each other along the y-direction with a half-pitch of about 100 nm or less;
    exposing the surface to a plasma;
    illuminating the surface with a pulsed laser beam during the exposure to the plasma, the pulsed laser beam having a predetermined polarization along the x-direction or the y-direction; and
    etching the trenches,
    wherein, due to the predetermined polarization of the pulsed laser beam, the first trench portions are etched differently than the second trench portions.

14. The method of claim 13, wherein the predetermined polarization of the pulsed laser beam is perpendicular to the x-direction.

15. The method of claim 14, wherein the etching of the trenches comprises preferential etching of base regions of the first trench portions and preferential etching of upper regions of the second trench portions, and wherein, during the illumination of the surface, the base regions of the first trench portions are locally heated, and the upper regions of the second trench portions are locally heated.

16. The method of claim 13, wherein the predetermined polarization of the pulsed laser beam is perpendicular to the y-direction.

17. The method of claim 16, wherein the etching of the trenches comprises preferential etching of upper regions of the first trench portions and preferential etching of base regions of the second trench portions, and
wherein, during the illumination of the surface, the upper regions of the first trench portions are locally heated, and the base regions of the second trench portions are locally heated.

18. The method of claim 13, wherein the pulsed laser beam has a wavelength at least about an order of magnitude larger than the half-pitch.

19. The method of claim 13, wherein the plasma comprises:
an ionized noble gas selected from the group consisting of: Ar, He, and Ne; and
an ionized etch gas selected from the group consisting of: $SF_6$, $Cl_2$, $C_4F_8$, and $C_xF_y$, where $1 \leq x \leq 12$ and $1 \leq y \leq 12$.

20. The method of claim 13, wherein the substrate comprises a semiconductor.

* * * * *